United States Patent [19]

Perino et al.

[11] Patent Number: 5,525,528
[45] Date of Patent: Jun. 11, 1996

[54] FERROELECTRIC CAPACITOR RENEWAL METHOD

[75] Inventors: Stanley Perino; Sanjay Mitra, both of Colorado Springs, Colo.

[73] Assignee: Ramtron International Corporation, Colorado Springs, Colo.

[21] Appl. No.: 200,216

[22] Filed: Feb. 23, 1994

[51] Int. Cl.$^6$ .................................................. H01L 21/00
[52] U.S. Cl. .................................... 437/7; 437/8; 437/919; 29/25.03
[58] Field of Search ................................ 437/7, 8, 919; 29/25.03, 25.35; 324/548; 365/145

[56] References Cited

U.S. PATENT DOCUMENTS

| | | | |
|---|---|---|---|
| 4,644,259 | 2/1987 | Boser | 324/548 |
| 5,043,622 | 8/1991 | Sagong et al. | 29/25.35 |
| 5,146,299 | 9/1992 | Lampe et al. | 365/145 |
| 5,155,573 | 10/1992 | Abe et al. | 365/145 |
| 5,254,482 | 10/1993 | Fisch | 437/919 |
| 5,259,099 | 11/1993 | Banno et al. | 29/25.35 |
| 5,270,967 | 12/1993 | Moazzami et al. | 365/145 |
| 5,337,279 | 8/1994 | Gregory et al. | 365/145 |

*Primary Examiner*—Brian E. Hearn
*Assistant Examiner*—Kevin M. Picardat

[57] ABSTRACT

Ferroelectric capacitors in an integrated memory are renewed to improve retention performance. The renewal method is performed on a wafer containing ferroelectric memory die. In one method, a rejuvenation anneal is performed after all electrical tests, including those at elevated temperatures, have been accomplished, but before the failed die have been inked. The rejuvenation anneal is performed at or above the Curie temperature of the ferroelectric material. In the preferred embodiment, the ferroelectric material is PZT, and the rejuvenation anneal is a thermal treatment at 400° Centigrade in a nitrogen flow of roughly ten liters per minute for about an hour. In another method, separate electrical cycling and depoling operations are performed to provide the equivalent benefits of the single rejuvenation anneal. The electrical cycling operation is accomplished by writing about one hundred cycles at five volts alternating logic states into each ferroelectric capacitor into the array. The electrical cycling operation restores the symmetry and location of the hysteresis loop. The ferroelectric capacitor is then returned to the virgin state by a depoling operation. The electrical depoling operation is achieved by writing each capacitor in the array to a logic one and a logic zero at the full five volt power supply level initially, and then repeating each write cycle at decreasing power supply levels. The writing cycles are continued until the power supply is reduced to a minimum functional level and the polarization on the capacitors has been substantially removed.

26 Claims, 5 Drawing Sheets

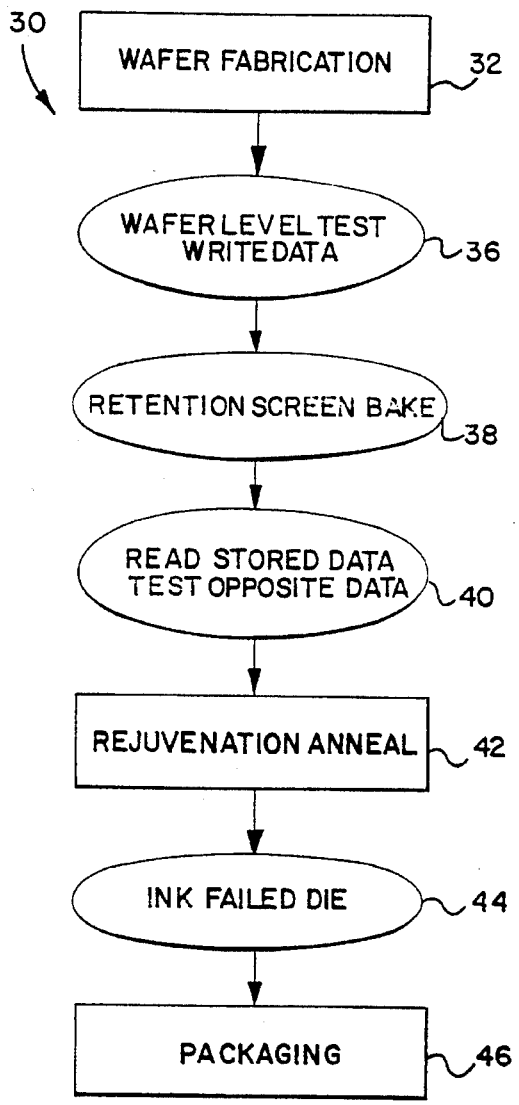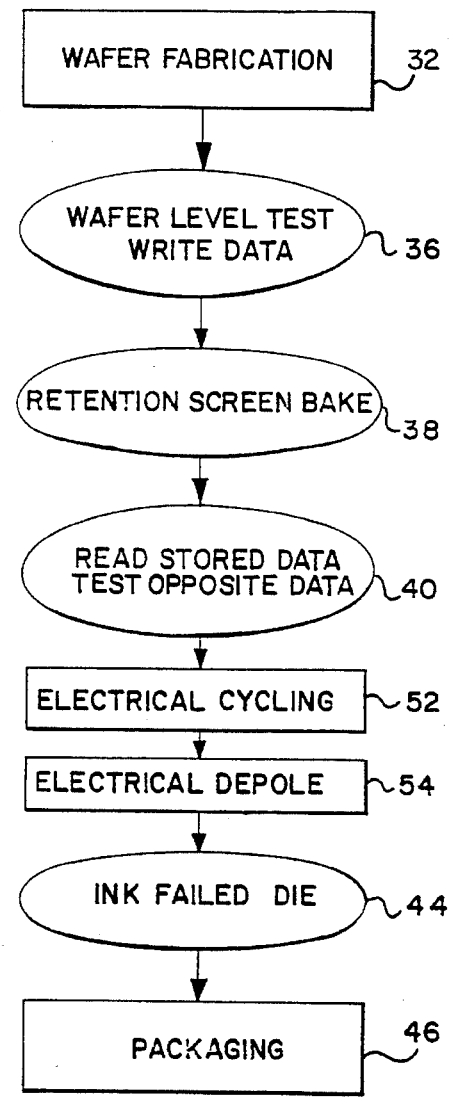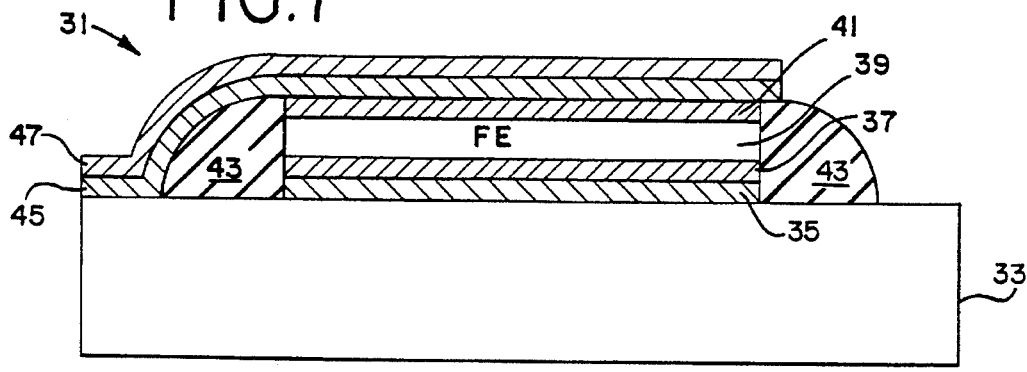

1

FERROELECTRIC CAPACITOR RENEWAL METHOD

BACKGROUND OF THE INVENTION

This invention relates generally to ferroelectric capacitors and corresponding ferroelectric memories and, more particularly, to an improved test and fabrication method for integrated circuit ferroelectric memories.

It is well known that certain materials such as lead zirconate titanate ("PZT"), barium titanate, phase III potassium nitrate, and others are "ferroelectric" in that they can retain a reversible electric polarization in the absence of an applied electric field. The stable polarization results from the alignment of internal dipoles with the perovskite crystal units in the ferroelectric material. Application of an electric field exceeding a critical level known as the "coercive voltage" causes the alignment of the dipoles. Application of the electric field across a ferroelectric material causes the alignment of the dipoles in one direction. Reversal of the polarity of the applied field also reverses the alignment of the internal dipoles. However, it may be noted that the coercive voltage may not always be well defined in some ferroelectric materials. Also, it is known that the rate of alignment of the dipoles is related to the overdrive voltage, i.e. the amount by which the applied voltage exceeds the coercive voltage. The position of the dipoles and the associated electric charge in response to an applied electric field can be detected with appropriate sensing circuitry. Ferroelectric materials such as PZT, therefore, can be used as the dielectric material in a ferroelectric capacitor that in turn is used as the memory element in a nonvolatile memory cell. In order to be useful as the memory element in a semiconductor nonvolatile memory, however, a ferroelectric capacitor must retain data for an extended period of time at a given storage temperature. The ability to retain data, also known as retention performance, is adversely affected by a multifaceted mechanism known generally as imprint. The term imprint is used because it implies that the history of the data stored in the ferroelectric capacitor affects its retention performance. Specifically, storage of data of the same binary value for a long period of time at temperature degrades the ability of the ferroelectric capacitor to retain data of the opposite binary value.

Data storage and imprint degradation of retention can be explained by examining changes in a hysteresis loop associated with a ferroelectric capacitor. Referring now to FIG. 1A, a normal hysteresis loop 10 for a ferroelectric material is shown as a plot of the polarization or charge on the y-axis corresponding to the applied electric field or voltage on the x-axis. Two different stable polarization states 12 and 14 are illustrated that exist at a zero applied electric field. Binary data is stored in the ferroelectric capacitor by setting the polarization in either of the two states 12 or 14. These stable states of polarization can be designated "up" or "down" to imply a polarity or direction to the polarization. The initial or virgin state of a capacitor prior to the application of any electric field is not described by the single hysteresis loop 10 since no net polarization has been set into the capacitor. The virgin state exists at the origin of the plot, i.e. zero applied field and zero polarization. Note that a normal hysteresis loop 10 is generally centered around the origin of the plot. Application of an electric field of a sufficient magnitude polarizes, or "poles", the ferroelectric capacitor and sets it into one of the up or down polarization states 12 or 14. It should be noted that a ferroelectric dielectric material such as PZT is ferroelectric only below a characteristic temperature known as the Curie temperature. For PZT this temperature is about 400° Centigrade. Above the Curie temperature the hysteresis loop 10 is collapsed and the dielectric material is paraelectric, i.e. the material loses its ability to retain an electric polarization in the absence of an applied electric field.

A ferroelectric memory cell 11 built with ferroelectric capacitors C1 and C2 is shown in FIG. 1B. Each of capacitors C1 and C2 ideally have a normal hysteresis loop 10 as shown in FIG. 1A. Ferroelectric memory cell 11 is a two transistor, two capacitor ("2T-2C") memory cell that includes pass transistors M1 and M2 each serially coupled to ferroelectric capacitors C1 and C2. The data states of memory cell 11 are defined by complementary polarization states in the ferroelectric capacitors. For example, an up polarization state in capacitor C1 and a down polarization state in capacitor C2 may represent a logic "one", while a down polarization state in capacitor C1 and an up polarization state in capacitor C2 may represent a logic "zero." As in a typical DRAM cell, memory cell 11 includes a word line 13 coupled to the gates of transistors M1 and M2, and, since the cell is complementary, complementary bit lines 17 and 19, respectively coupled to the drains of transistors M1 and M2. In addition to the familiar word and bit lines, ferroelectric memory cell 11 also includes an active plate line coupled to the bottom plate of capacitors C1 and C2 that is pulsed during both reading and writing operations.

Flipping the polarization between the two stable states of a ferroelectric material, or "switching", evolves a significant amount of charge that can be detected by an electrical sensing circuit. Significantly more charge is evolved by switching than if no change in the polarization state occurred. Consequently, the stored state, or data value, is detected by electrically pulsing the ferroelectric capacitor and measuring the amount of charge evolved. This state-dependent difference in evolved charge with the application of a voltage pulse is illustrated in FIGS. 2A and 2B. In FIG. 2A a first amount of charge, $Q_1$, is evolved by switching the ferroelectric capacitor from stable state 14 to a saturated point 16 on hysteresis loop 10. Charge $Q_1$ is referred to as the "switched charge" and always corresponds to a flipped polarization state. In FIG. 2B a second amount of charge, $Q_2$, which is significantly less than charge $Q_1$, is evolved by driving the ferroelectric capacitor from stable state 12 to a saturated point 16 on hysteresis loop 10. Charge $Q_2$ corresponds to sensing the same polarization state. The difference in charges $Q_1$ and $Q_2$ can be detected by the electrical sensing circuitry in a non-volatile memory.

Imprinting degrades the hysteresis loop 10 and the opposite state data retention performance by shifting the loop along the x-axis and by distorting the shape of the loop, which are both illustrated in FIGS. 3A–3C, as well as by other mechanisms. Both the direction of the loop shift and the shape of the loop distortion can reduce the charge available for sensing opposite state data. Referring now to FIG. 3A, a normal hysteresis loop 10 is shown, wherein a full $Q_1$ charge is produced when the data state is flipped from initial state 14. A distorted hysteresis loop 10A is shown in FIG. 3B, wherein a charge $Q_{1A}$ less than charge $Q_1$ is produced when the data stated is flipped from initial state 14A. A shifted hysteresis loop 10B is shown in FIG. 3C, wherein a charge $Q_{1B}$ less than charge $Q_1$ is produced when the data stated is flipped from initial state 14B. The shift and distortion mechanisms are also known by other names. Shift of the hysteresis loop 10 on the x-axis is also known as "compensation", which produces an asymmetric loop, and loop distortion is known as "relaxation".

The loss of charge that is needed to electrically sense the opposite data state ($Q_1-Q_2$, as shown individually in FIGS. 2A and 2B) is made more apparent by baking a poled ferroelectric capacitor for long time periods at elevated temperatures above room temperature but below the Curie temperature. Referring now to FIG. 4, the charge available for detection by an electrical sensing circuit decreases linearly with the logarithm of time, and the slope of this decrease depends on temperature. This time and temperature dependence of the opposite state charge is called "aging" due to its functional time dependence. Line 18 represents the decrease in charge with time at a first temperature $T_1$. Line 20 represents the greater decrease in charge with time at a second elevated temperature $T_2$. The charge value for either line 18 or 20 is eventually reduced to a critical or cutoff value at which insufficient charge exists for electrically distinguishing the state of the data. Retention failure occurs when the available charge is degraded to the cutoff charge.

Unfortunately, conventional integrated circuit fabrication and test methods involve significant thermal treatment after the ferroelectric capacitors have been poled, causing further degradation of opposite state retention performance prior to shipment to the customer. These thermal treatments are encountered as bakes for screening retention performance prior to packaging. Thermal treatments are used in screening to elevate the testing temperature, which in turn desirably decreases testing time. Thermal treatments are also typically used in molding and curing steps in a plastic packaging process.

Blind Build Process Flow

One ferroelectric memory integrated circuit process flow that avoids aging induced charge degradation during manufacturing is to "blind build" or avoid poling the capacitors until after packaging. The ferroelectric capacitors in the memory array thus remain in the virgin state and no distortion or shifting occurs to the hysteresis loop. Since the memory parts are not tested, no electric field has been applied across the ferroelectric capacitor and no net polarization exists. With no net polarization there is no driving force for the imprint mechanism and capacitor degradation is greatly reduced during the subsequent thermal treatments of the packaging process. The test and packaging process steps for the blind build process flow are shown in FIG. 5. Process flow 22 includes wafer fabrication step 24; packaging step 26, which may include heat treatments below the Curie temperature; and electrical testing step 28.

The blind build process flow is somewhat unsatisfactory for several reasons. Package costs are raised because bad die are not screened out at wafer level test and undergo the unnecessary expense of packaging. Quality is also negatively impacted since no rapid feedback is provided to wafer manufacturing for process control. Efforts to improve the yield of finished good parts are difficult since yield loss at the packaging step cannot be distinguished from yield loss during wafer fabrication.

What is desired, therefore, is a method for improving a conventional ferroelectric memory wafer test and plastic package flow so that imprint degradation of switched charge can be minimized or eliminated.

SUMMARY OF THE INVENTION

It is, therefore, a principal object of the present invention to minimize the effects of imprint degradation on switched charge and therefore improve retention performance in a ferroelectric memory integrated circuit.

It is another object of the invention to improve the yields of ferroelectric memory integrated circuits.

It is an advantage of the invention that the initial quality requirements for the ferroelectric capacitors in a memory can be loosened while still maintaining high quality in the finished (tested and packaged) parts.

It is another advantage of the invention that it is simple and cost effective.

According to the present invention a method is disclosed for renewing a ferroelectric capacitor in an integrated memory wherein the symmetry and centered location of a characteristic hysteresis loop are restored and the capacitor is depoled so that it returns to a virgin state. The renewal method is performed on a wafer containing ferroelectric memory die. The method minimizes the effects of imprint degradation and improves retention performance. In a first method, a rejuvenation anneal is performed after all electrical tests, including those at elevated temperatures, have been accomplished, but before the failed die have been inked. The rejuvenation anneal is performed at or above the Curie temperature of the ferroelectric material. In the preferred embodiment, the ferroelectric material is PZT, and the rejuvenation anneal is a thermal treatment at 400° Centigrade in a nitrogen flow of roughly ten liters per minute for about an hour. In a second method, separate electrical cycling and depoling operations are performed to provide the equivalent benefits of the single rejuvenation anneal. The electrical cycling operation is accomplished by about one hundred cycles of writing at five volts a logic "one" and then subsequently a logic "zero" into each ferroelectric capacitor into the array. The electrical cycling operation restores the symmetry and location of the hysteresis loop. The ferroelectric capacitor is then returned to the virgin state by a depoling operation. The electrical depoling operation is achieved by writing each capacitor in the array to a logic one and a logic zero at the full five volt power supply level initially, and then repeating each write cycle at decreasing power supply levels. The writing cycles are continued until the power supply is reduced to a predetermined minimum level and the polarization on the capacitors has been substantially removed. If desired, the electrical depoling operation can be performed without the electrical cycling operation.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 6 is a test and package process flow for an integrated circuit ferroelectric memory according to a first embodiment of the present invention, including a rejuvenation anneal;

FIG. 7 is a cross-sectional diagram of a ferroelectric capacitor stack capable of withstanding the rejuvenation anneal shown in the process flow of FIG. 6;

FIG. 8 is a test and package process flow for an integrated circuit ferroelectric memory according to a second embodiment of the present invention, including electrical cycling and electrical depoling operations;

DETAILED DESCRIPTION

Figure 1A:
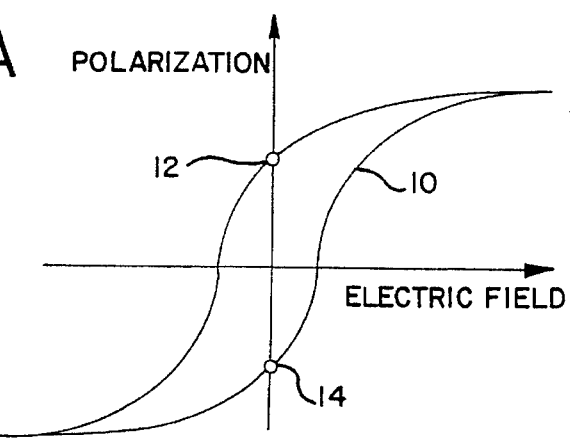
FIG. 1A is a plot of a hysteresis loop associated with a ferroelectric capacitor showing two stable polarization states.
Figure 1B:
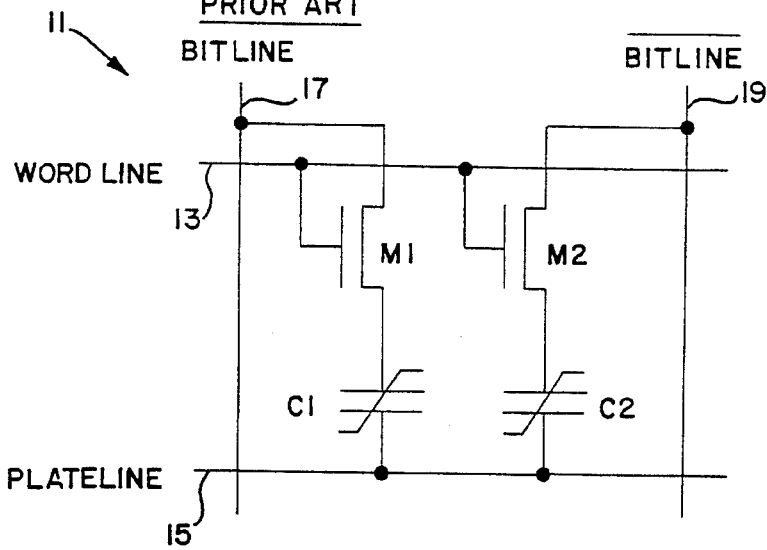
FIG. 1B is a schematic diagram of a 2T-2C ferroelectric memory cell in which the electrical characteristics of the ferroelectric capacitors in the cell are described by the hysteresis loop shown in FIG. 1A.
Figure 2A:
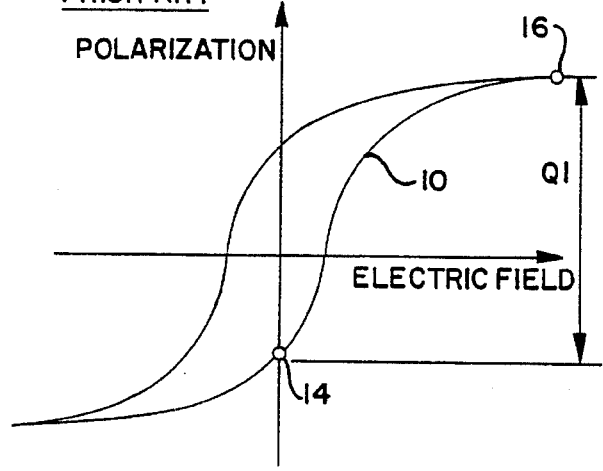
FIG. 2A is a plot of a hysteresis loops showing the charge evolved in changing polarization direction from one polarization state to another due to an external applied electric field.
Figure 2B:
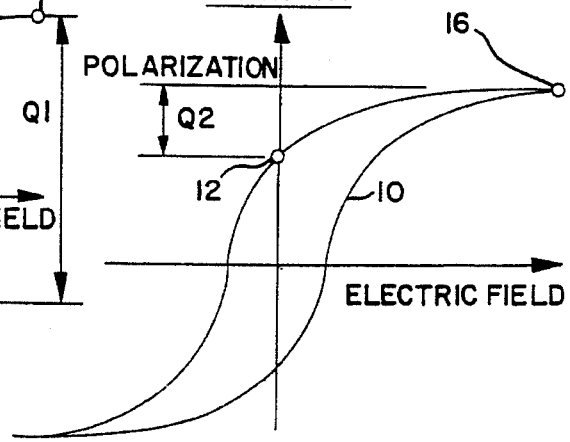
FIG. 2B is a plot of a hysteresis loop showing the lesser charge evolved in maintaining the same polarization direction in response to an external applied electric field.
Figure 3A:
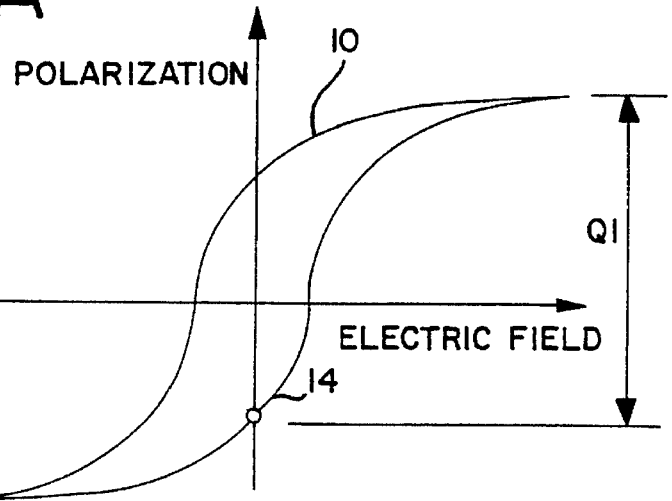
FIGS. 3A–3C show a normal hysteresis loop, a distorted hysteresis loop, and a shifted hysteresis loop, as well as the switched charge associated with each loop.
Figure 3B:
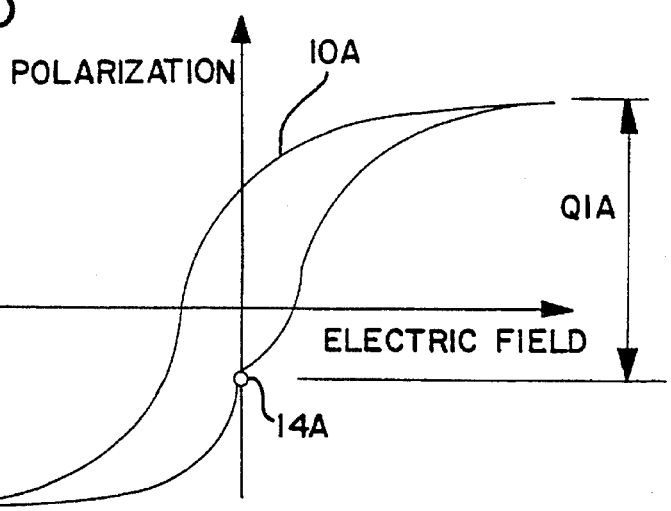
Figure 3C:
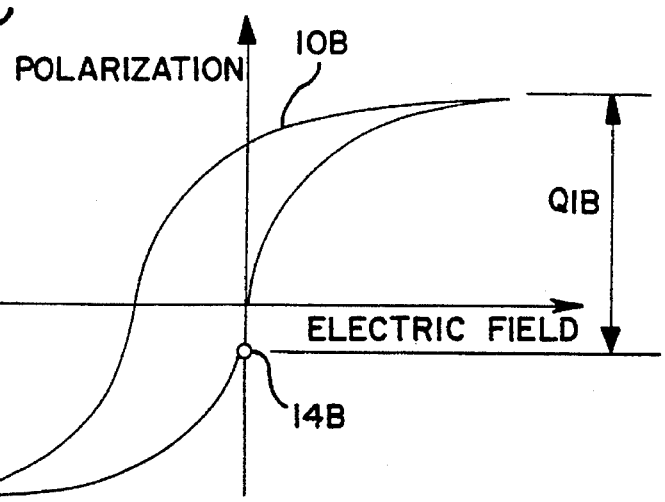
Figure 4:
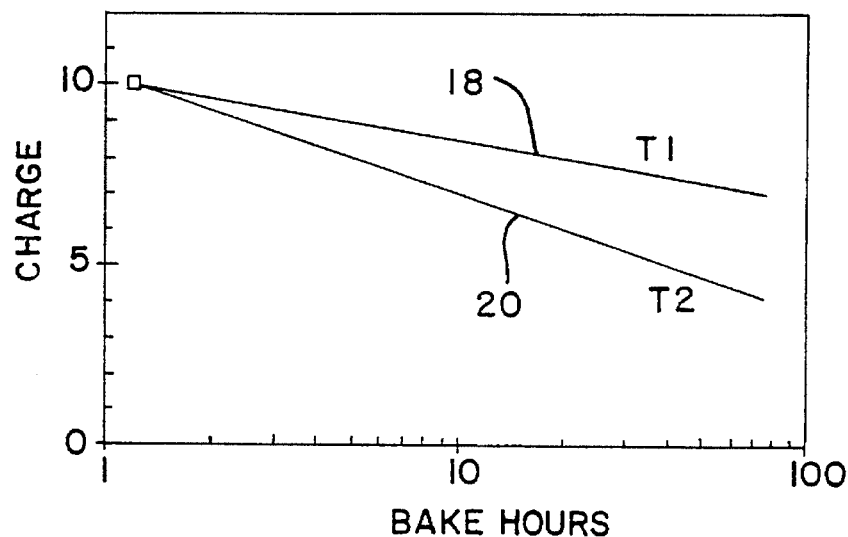
FIG. 4 is a plot illustrating the decrease in charge with time in a ferroelectric capacitor at two distinct temperatures.
Figure 5:
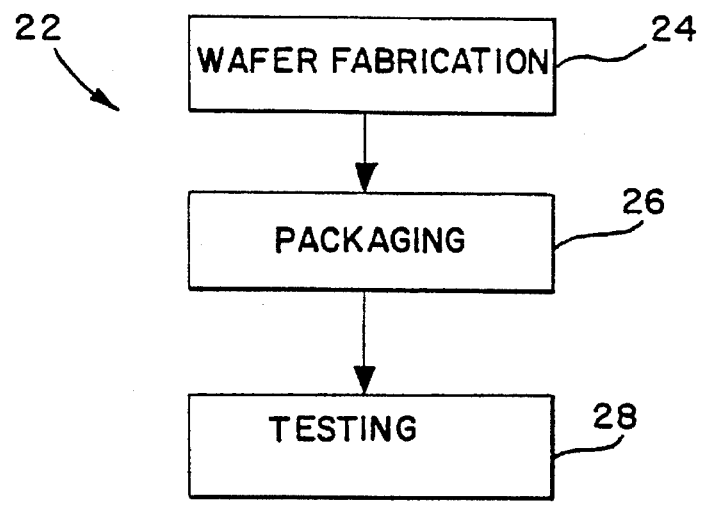
FIG. 5 is a block diagram of a prior art blind build test and package process flow for an integrated circuit ferroelectric memory.

With reference generally to FIGS. 6–10, a method is disclosed for renewing a ferroelectric capacitor in an integrated memory. In the first two described methods, it is contemplated that sub-Curie temperature treatments have occurred that affect the shape and location of the characteristic hysteresis loop of the ferroelectric capacitors. In the first and second methods, therefore, the symmetry and centered location of the characteristic hysteresis loop of the ferroelectric capacitor are both restored and the capacitor is depoled so that it returns to a virgin state. In the third described method, it is contemplated that sub-Curie temperature treatments have not occurred and the restoration of the loop shape and location are not necessary. The third method therefore only prevents degradation of switched charge during a subsequent packaging step through depoling of the ferroelectric capacitors to return them to a virgin state. All three methods are performed advantageously on a wafer containing ferroelectric memory die. The goal of all three methods, generally, is to minimize the effects of imprint degradation and to improve retention performance.

Rejuvenation Anneal Process Flow

The block diagram of a first improved process flow 30 according to the present invention is shown in FIG. 6. The process flow begins with wafer fabrication step 32. Wafer fabrication step 32 includes many substeps, terminating with the complete fabrication of a silicon wafer including fully formed (and preferably passivated) ferroelectric integrated memory circuits, wherein each memory circuit includes a plurality of ferroelectric capacitors in a grid of memory cells. It is not necessary to use a particular design, layout, or process to practice the invention, as long as a ferroelectric material is used as the dielectric material in the memory cell data storage capacitors. The physical structure of the capacitor stack as well as the layers used for electrical interconnection on the integrated circuit, however, must be of sufficient mechanical and thermal integrity to withstand the rejuvenation anneal described below without damage. The process flow 30 continues with a testing step 36 that includes wafer level testing of the die as well as writing data to the memory cells. Typically, the components of wafer level testing fall into three categories: DC or parametric testing, AC or timing tests, and functional testing. The DC test parameters are the static levels on each integrated circuit pin in various operational modes such as input and output current leakage, standby and active power consumption, as well as input and output voltage and current levels. The AC test parameters are the minimum and maximum responses from the device such as access time, address set-up times, and data hold times. Functional tests ensure that the individual bits of the memory in various modes of operation are fully operational over specified minimum and maximum voltages and temperatures and include tests such as: stuck bits (whether or not a bit in the memory always reads the same polarity); voltage bump, wherein the ground and power supply rails are disturbed; logic; as well as various pattern writing tests to check the operation of the memory column and row decoders.

Improved process flow 30 continues with a retention screen bake step 38. A retention screen bake is used to accelerate failures in the memory cells, so that weak parts can be screened out. A sub-Curie temperature of about 150° C. is used, which translates into a time multiplication factor to room temperature of about 100,000. The retention screen bake step 38 thus performs an equivalent screen over about one million hours at room temperature or 10,000 hours at 70° C. The retention screen bake is thus useful because any die with unusually poor retention performance that are not representative of an average or typical die fail the test and are discarded. The elimination of infant fails improves the overall quality of the die population. However, the retention screen bake degrades the performance of the average die because a portion of its retention lifetime has been used up by the retention screen bake through the imprint mechanism.

Once the wafer has been functionally tested and subjected to a retention screen bake, the stored data is read and the opposite data state is tested at step 40. The stored data is typically read to insure each memory cell possesses sufficient ferroelectric charge to retain data. During the retention screen bake, all residual voltages applied during the wafer level test have bled off and true non-volatile memory operation is achieved. The opposite data state is typically read to insure that the memory element can retain data of both polarities and that all memory elements withstand the adverse effects of the imprint mechanism. The opposite data state portion of the test is typically accomplished by writing the complement of the data stored during the retention screen bake, pausing for a period of time sufficient for all cell voltages to decay to zero which is typically 3 seconds at 90° C., and reading the stored data.

After testing step 40 is accomplished, a rejuvenation anneal step 42 is performed. The preferred rejuvenation anneal step 42 is a thermal treatment at 400° C. in a nitrogen flow of roughly ten liters per minute for about one hour. The furnace used is a conventional quartz hot wall tube furnace. The wafers are loaded onto a quartz boat, and the boat is manually pushed into the center section of the tube for the duration of the anneal. The anneal temperature is approximately equal to or greater than the Curie temperature of the ferroelectric layer. If PZT is used as the ferroelectric material, the anneal temperature used is about 400° C., which is approximately equal to the Curie temperature. The time and temperature of the rejuvenation anneal are sufficient to accomplish two distinct phenomena. The trapped charge resulting in a built-in internal bias or loop shift is effectively removed, and the ferroelectric capacitors are "depoled", i.e. any net polarization is removed. The removal of the trapped charge repairs or "rejuvenates" the imprint degradation incurred in the retention bake testing. The anneal induced depoling makes the capacitor element substantially insensitive to imprint damage during the subsequent thermal treatments of the plastic packaging process step 46.

After the rejuvenation anneal step 42 is accomplished, the bad die on the wafer are inked, and the good die that passed the various testing steps are left un-inked. The anneal step 42 is done prior to the bad die inking step to avoid any contamination issues regarding the presence of ink on a wafer at the elevated temperature of the rejuvenation anneal.

After the wafer is inked, it is scribed and cut into individual die. The individual die that have not been inked are packaged at step 46. Step 46 can include plastic packaging as well as ceramic packaging. If a plastic packaging step is used, the die is subjected to further heat treatments, resulting in further undesirable electric stress on the ferroelectric capacitors. The rejuvenation anneal step 42 minimizes the damage caused by the plastic packaging step.

An integrated ferroelectric capacitor stack 31 having sufficient mechanical and thermal integrity to withstand the rejuvenation anneal step 42 is shown in the cross-sectional diagram of FIG. 7. Ferroelectric capacitor stack 31 is formed on a silicon substrate 33 or the like, the surface of which is ion milled for proper adhesion to a titanium (Ti) adhesion layer 35, which is about 200 Angstroms thick. A bottom electrode layer 37 preferably comprised of platinum (Pt) is deposited on the surface of the adhesion layer 35 to a thickness of about 1500 to 1750 Angstroms. A ferroelectric layer 39 is subsequently deposited on the surface of bottom electrode layer 37 to a thickness of about 3000 Angstroms. Ferroelectric layer 39 preferably comprises PZT. A top electrode layer 41, which may also be platinum, is deposited on the surface of the ferroelectric layer 39 to a thickness of about 1500 to 1750 Angstroms. Layers 35 through 41 are subsequently etched, not necessarily simultaneously, and are laterally isolated with isolation features 43. The surface of top electrode layer 41 is subsequently ion milled for proper adhesion. The top electrode layer 41 of capacitor stack 31 is then contacted with a dual layer metalization consisting of metal layers 45 and 47. A bottom metal layer 45 is deposited on the surface of top electrode 41. The bottom metal layer 45 is preferably titanium nitride (TiN) deposited to a thickness of about 800 Angstroms, which is oxidized in an $O_2$ rich atmosphere for about thirty seconds at 400° C. The surface of metal layer 45 is then ion milled for proper adhesion. A top metal layer 47 is deposited on the surface of bottom metal layer 45. The top metal layer 47 is preferably aluminum (Al) deposited to a thickness of about a micron. The bottom electrode 37 is similarly contacted with a titanium nitride and aluminum dual layer metalization, which is not illustrated in the cross-sectional view of FIG. 7. While the capacitor stack 31 shown in FIG. 7 is capable of withstanding the rejuvenation anneal step 42 described above, many other such capacitor stack configurations are possible. Materials other than those described above can also be used if properly selected. Proper thicknesses of materials must be maintained to prevent lift-off and cracking. In addition, the surfaces of certain materials must be ion milled or otherwise prepared to assure proper adhesion of material layers. Materials should be selected so they are thermally stable at the rejuvenation anneal temperature. The interface between material layers must also be thermally stable at the anneal temperature. For example, the direct interface between aluminum and platinum is unstable at 400° C. and should therefore be avoided.

Electrical Cycling and Depole Process Flow

The block diagram of a second improved process flow 50 according to the present invention is shown in FIG. 8. As in the previous process flow, the second process flow begins with wafer fabrication step 32. Wafer fabrication step 32 includes the same sub-steps, terminating with the complete fabrication of a silicon wafer including fully formed and passivated ferroelectric integrated memory circuits, wherein each memory circuit includes a plurality of non-volatile ferroelectric capacitors in a grid of memory cells. Again, it is not necessary to use a particular design, layout, or process to practice the invention, as long as a ferroelectric material is used as the dielectric material in the memory cell data storage capacitors. The physical structure of the capacitor stack as well as the layers used for electrical interconnection on the integrated circuit is not as important in this process flow, because there is no rejuvenation anneal to create structural damage. The process flow 50 continues with a testing step 36 that includes wafer level testing of the die as well as writing data to the memory cells. Testing step 36 is identical to that in the previous process flow 30.

Improved process flow 50 continues with a retention screen bake step 38. As in the previous process flow, the retention screen bake step 38 is used to accelerate failures in the memory cells, so that weak parts can be screened out and is identical to step 38 in the previous process flow. Once the wafer has been functionally tested and subjected to a retention screen bake, the stored data is read and the opposite data state is tested at step 40. Step 40 is identical to that in the previous process flow.

After testing step 40 is accomplished, an electrical cycling step 52 is performed. Electrical cycling is done to restore hysteresis loop shape and symmetry. In the preferred embodiment, the electrical cycling step 52 is accomplished by writing about one hundred repetitions of alternating data states into the memory cells in each die with the full five volt power supply voltage, that is, writing at five volts into each ferroelectric capacitor a logic one state and then a logic zero state at negative five volts, and then repeating this process for about one hundred cycles.

Figure 9:
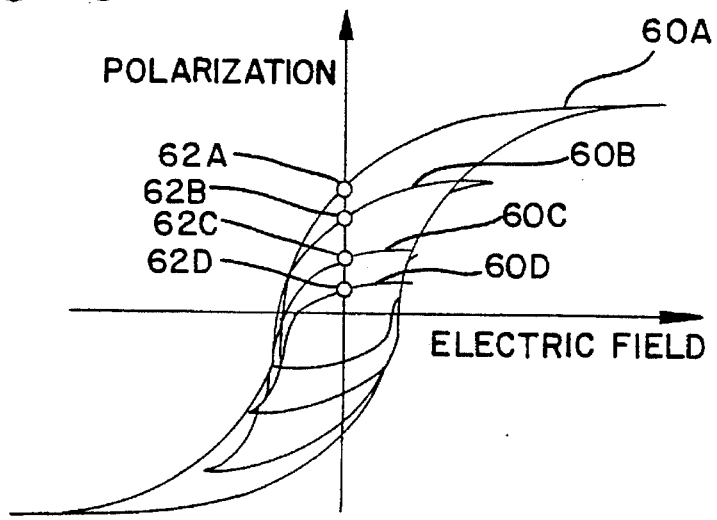
FIG. 9 is a plot of nested hysteresis loops associated with the depoling operation of FIG. 8.

After electrical cycling step 52 is accomplished, an electrical depoling step 54 is done to remove the polarization in the ferroelectric capacitors and to avoid aging degradation during packaging. The electrical depoling is achieved by writing each bit (each storage location) to both (one and then the other complementary) data polarities at sequentially decreasing voltage levels. Specifically, the entire array of capacitors is written to each data state sequentially (a one then a zero or vice-versa) with the power supply for the memory set to the full nominal power supply voltage, i.e. five volts. Next, the voltage powering the memory, which translates into the available writing voltage, is reduced by a predetermined incremental voltage such as 0.5 volts, and each memory cell in the array is again sequentially written to both data states. The voltage supply is further reduced in 0.5 volt increments until a nominal minimum operational voltage, such as 2.5 volts, is achieved and the memory cells are written to with the nominal minimum voltage. The polarization of the ferroelectric capacitor during the electrical depole step 54 is described as a series of subloops of decreasing amplitude as shown in FIG. 9. The plot of FIG. 9 shows four subloops 60A through 60D having decreasing polarization. The polarization of the zero electric field stable states (i.e. y-axis crossings) 62A through 62D are correspondingly moved closer to the origin of the graph. The polarization of the capacitor is significantly reduced by these low voltage writes, resulting in a quasi-virgin state. However, the final stable state of the capacitor is not set identically to zero since the integrated circuit itself will cease functioning at very low voltages less than 2.5 volts.

The cycling step 52 and the depoling step 54 taken in conjunction are roughly equivalent to the rejuvenation anneal process step 42 except that the capacitor renewal is electrically induced instead of thermally induced. An advantage of the electrical process flow 50 over the thermal process flow 30 is that it is practically applicable to all ferroelectrics including those with very high Curie temperatures. The electrical process flow 50 does not require structural integrity of the capacitor stack to be maintained at the Curie temperature.

After steps 52 and 54 are accomplished, the bad die on the wafer are inked, and the good die that passed the various testing steps are left uninked. Steps 52 and 54 are done prior to the bad die inking step, but the contamination issues regarding the presence of ink on a wafer at the elevated temperature do not exist since the rejuvenation anneal is not performed in this process flow.

After the wafer is inked, it is scribed and cut into individual die. The good individual die are packaged at step 46. Step 46 can include plastic packaging as well as ceramic packaging. If a plastic packaging step is used, the die is subjected to further heat treatments, resulting in further undesirable electric stress on the ferroelectric capacitors. As in the previous flow, steps 52 and 54 minimize the damage caused by the plastic packaging step.

Electrical Depole Process Flow

Figure 10:
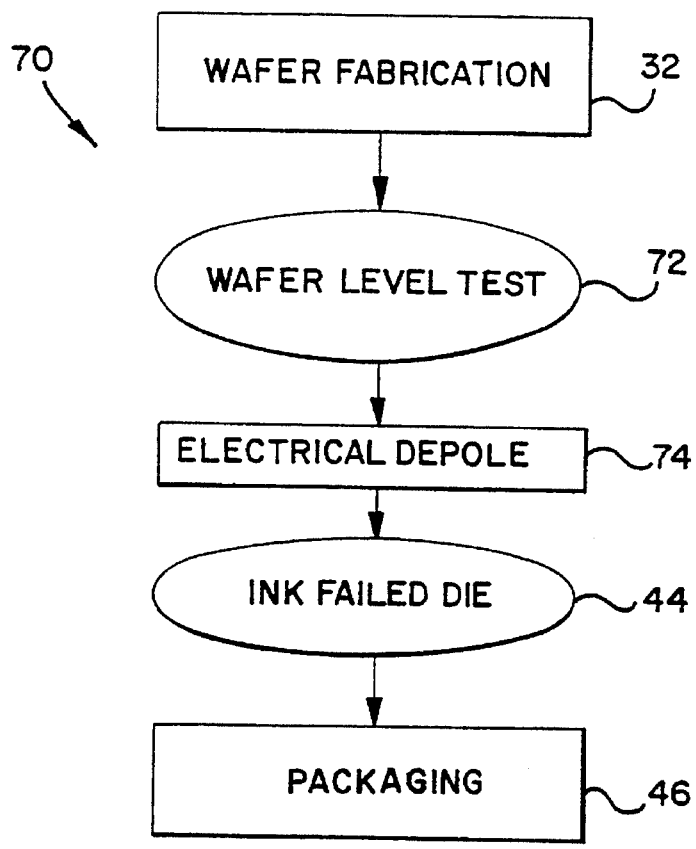
FIG. 10 is a test and package process flow for an integrated circuit ferroelectric memory according to a third embodiment of the present invention, including only the electrical depoling operation.

Referring now to FIG. 10, a block diagram of a process flow 70 is shown solely for preventing damage during the plastic packaging step 46. The wafer level test flow 70 shown in FIG. 10 consists of wafer level tests only without any bakes for long term retention testing. Hence, degradation of opposite state retention performance due to the retention screen bakes is eliminated. In order to avoid imprint damage during plastic packaging, however, the ferroelectric capacitors must be depoled. The depoling is accomplished electrically as step 74, which occurs after the functional testing step 72. The depoling step 74 is identical to step 54 in process flow 50. After the capacitors have been depoled, the bad die are inked at step 44, and the wafer is cut into individual die. The good die are packaged at step 46. Room temperature testing can be performed at the wafer level, at the packaged die level, or at both in process flow 70.

Having described and illustrated the principles of the invention in a preferred embodiment thereof, it is appreciated by those having skill in the art that the invention can be modified in arrangement and detail without departing from such principles. For example, the exact temperature and times for the rejuvenation anneal can be modified for other ferroelectric materials. Further, the number of cycles used in the electric cycling step can be changed if desired for another application. Further, the incremental voltage and minimum voltage used in the electrical depoling step can be changed for another type of ferroelectric material or for another application. We therefore claim all modifications and variation coming within the spirit and scope of the following claims.

We claim:

1. A method of manufacturing ferroelectric memories comprising the steps of:

fabricating a plurality of ferroelectric memory integrated circuits on a wafer;

thermally treating the wafer at a first temperature less than the Curie temperature of the ferroelectric material in the memory circuits sufficiently to cause imprint degradation;

electrically testing the memory circuits to identify bad die that have failed the electrical test and good die that have passed the electrical test; and annealing the wafer at a second temperature equal to or greater than the Curie temperature of the ferroelectric material in the memory circuits to restore a virgin state of polarization in the ferroelectric capacitors so that the imprint degradation caused by thermally treating the wafer at the first temperature is minimized and retention performance is improved.

2. The method of claim 1 in which the annealing step further comprises the step of exposing the wafer to a nitrogen flow for about an hour.

3. The method of claim 1 in which the annealing step is conducted in a nitrogen flow of about ten liters of nitrogen per minute.

4. The method of claim 1 in which the fabricating step comprising the step of fabricating a plurality of non-volatile PZT ferroelectric memory integrated circuits on a silicon wafer.

5. The method of claim 4 in which the annealing step is conducted at a temperature of about 400° C.

6. The method of claim 1 in which the electrical testing step comprises the steps of:

reading a first data state stored in the ferroelectric capacitors in the memory integrated circuit; and subsequently reading a second data state opposite to the first data state.

7. The method of claim 1 further comprising the steps of inking the bad die.

8. The method of claim 7 further comprising the steps of:

creating individual die from the wafer; and packaging the good die.

9. The method of claim 8 in which the step of packaging the good die comprises the step of packaging the good die in plastic packages.

10. The method of claim 1 in which the fabricating step includes the step of creating a ferroelectric capacitor stack and associated electrical interconnection of sufficient mechanical and thermal integrity to withstand the annealing step without damage.

11. A manufacturing method for an integrated circuit PZT ferroelectric memory that is performed on a wafer including a plurality of the ferroelectric memories, the method comprising the step of annealing the wafer at about 400° C. in a nitrogen flow of about ten liters per minute for about an hour.

12. A renewal method for imprinted ferroelectric capacitors in an integrated circuit memory comprising the steps of:

fabricating a plurality of ferroelectric memory integrated circuits on a silicon wafer;

thermally treating the wafer at a first temperature less than the Curie temperature of the ferroelectric material in the memory circuits;

electrically testing the memory circuits at the wafer level to identify bad die that have failed the electrical test and good die that have passed the electrical test;

electrically cycling the memory circuits; and electrically depoling the memory circuits to restore a virgin state in the ferroelectric capacitors, wherein the electrical depoling step comprises the step of writing opposite data states into each of the ferroelectric capacitors in the memory circuits at sequentially decreasing voltage levels.

13. The method of claim 12 in which the electrical cycling step comprises the step of repetitively alternating opposite data states into each of the ferroelectric capacitors in the memory circuits.

14. The method of claim 12 in which the electrical cycling step is accomplished by writing about one hundred cycles of alternating opposite data states into each of the ferroelectric capacitors in the memory circuits at a full power supply voltage level.

15. The method of claim 12 in which the electrical testing step comprises the steps of:

reading a first data state stored in the ferroelectric capacitors in the memory integrated circuit; and subsequently reading a second data state opposite to the first data state.

16. The method of claim 12 further comprising the steps of inking the bad die.

17. The method of claim 16 further comprising the steps of:

creating individual die from the wafer; and packaging the good die.

18. The method of claim 17 in which the step of packaging the good die comprises the step of packaging the good die in plastic packages.

19. A renewal method for an integrated circuit ferroelectric memory performed on a wafer including a plurality of memory circuits, wherein each memory circuit includes a plurality of ferroelectric capacitors, the method comprising the steps of:

electrically cycling the memory circuits; and subsequently electrically depoling the memory circuits, wherein the electrical depoling step comprises the steps of:

(a) writing opposite data states into each of the ferroelectric capacitors in the memory circuit at a full power supply voltage level;

(b) subsequently reducing the writing voltage;

(c) subsequently writing opposite data states into each of the ferroelectric capacitors in the memory circuit at the reduced voltage; and (d) repeating steps (b) and (c) until the writing voltage has been reduced to a minimum voltage level.

20. The method of claim 19 in which the step of reducing the writing voltage comprises the step of reducing the writing voltage by an incremental voltage.

21. A renewal method for avoiding imprinting of ferroelectric capacitors in an integrated circuit memory comprising the steps of:

fabricating a plurality of ferroelectric memory integrated circuits on a silicon wafer;

thermally treating the wafer at a first temperature less than the Curie temperature of the ferroelectric material in the memory circuits;

electrically testing the memory circuits at the wafer level to identify bad die that have failed the electrical test and good die that have passed the electrical test; and electrically depoling the memory circuits to restore a virgin state in the ferroelectric capacitors, wherein the electrical depoling step comprises the step of writing opposite data states into each of the ferroelectric capacitors in the memory circuits at sequentially decreasing voltage levels.

22. The method of claim 21 further comprising the steps of inking the bad die.

23. The method of claim 22 further comprising the steps of:

creating individual die from the wafer; and packaging the good die.

24. The method of claim 23 in which the step of packaging the good die comprises the step of packaging the good die in plastic packages.

25. A renewal method for imprinted ferroelectric capacitors in an integrated circuit memory comprising the steps of:

fabricating a plurality of ferroelectric memory integrated circuits on a silicon wafer;

thermally treating the wafer at a first temperature less than the Curie temperature of the ferroelectric material in the memory circuits;

electrically testing the memory circuits at the wafer level to identify bad die that have failed the electrical test and good die that have passed the electrical test;

electrically cycling the memory circuits; and electrically depoling the memory circuits to restore a virgin state in the ferroelectric capacitors, wherein the electrical depoling step comprises the steps of:

(a) writing opposite data states into each of the ferroelectric capacitors in the memory circuit at the full power supply voltage level;

(b) reducing the writing voltage by an incremental voltage;

(c) writing opposite data states into each of the ferroelectric capacitors in the memory circuit at the reduced voltage; and (d) repeating steps (b) and (c) until the writing voltage has been reduced to a minimum voltage level.

26. A renewal method for avoiding imprinting of ferroelectric capacitors in an integrated circuit memory comprising the steps of:

fabricating a plurality of ferroelectric memory integrated circuits on a silicon wafer;

thermally treating the wafer at a first temperature less than the Curie temperature of the ferroelectric material in the memory circuits;

electrically testing the memory circuits at the wafer level to identify bad die that have failed the electrical test and good die that have passed the electrical test; and electrically depoling the memory circuits to restore a virgin state in the ferroelectric capacitors, wherein the electrical depoling step comprises the steps of:

(a) writing opposite data states into each of the ferroelectric capacitors in the memory circuit at the full power supply voltage level;

(b) reducing the writing voltage by an incremental voltage;

(c) writing opposite data states into each of the ferroelectric capacitors in the memory circuit at the reduced voltage;

(d) repeating steps (b) and (c) until the writing voltage has been reduced to a minimum voltage level.

* * * * *